(12) United States Patent
Zhang et al.

(10) Patent No.: US 6,303,451 B1
(45) Date of Patent: Oct. 16, 2001

(54) METHOD FOR FORMING A TRANSISTOR WITHIN AN INTEGRATED CIRCUIT

(75) Inventors: Xin Zhang; Kin Wai Tang; Carol Goh, all of Singapore; Soon Ee Neoh, Hillview Heights, all of (SG)

(73) Assignee: Chartered Semiconductor Manufacturing, LTD, Singapore (SG)

( * ) Notice: Subject to any disclaimer, the term of this patent is extended or adjusted under 35 U.S.C. 154(b) by 0 days.

(21) Appl. No.: 09/444,631

(22) Filed: Nov. 22, 1999

(51) Int. Cl.[7] ...................... H01L 21/336; H01L 21/302; H01L 21/461
(52) U.S. Cl. .......................... 438/301; 438/304; 438/723
(58) Field of Search ..................................... 438/304, 301, 438/723, 305, 299

(56) References Cited

U.S. PATENT DOCUMENTS

| | | | |
|---|---|---|---|
| 4,983,544 | * 1/1991 | Lu et al. ............................... | 437/200 |
| 5,258,095 | * 11/1993 | Nagata et al. ........................ | 156/643 |
| 5,428,240 | * 6/1995 | Lur ....................................... | 257/389 |
| 5,434,093 | * 7/1995 | Chau et al. ........................... | 437/41 |
| 5,728,619 | * 3/1998 | Tsai et al. ............................. | 438/297 |
| 5,834,795 | * 11/1998 | Lee ....................................... | 257/48 |
| 5,952,693 | * 9/1999 | Wu et al. .............................. | 257/344 |
| 6,037,233 | * 3/2000 | Liu et al. .............................. | 438/304 |
| 6,046,090 | * 4/2000 | Wu ....................................... | 438/303 |
| 6,071,826 | * 6/2000 | Cho et al. ............................. | 438/723 |
| 6,087,234 | * 7/2000 | Wu ....................................... | 438/299 |

* cited by examiner

Primary Examiner—John F. Niebling
Assistant Examiner—Walter Z. Lindsay, Jr.

(57) ABSTRACT

In one embodiment, a spacer layer (22) is formed overlying a gate electrode (16), which is formed on a semiconductor substrate (12). The spacer layer (22) is then etched to form a sidewall spacer (24). A scanning electron microscope (SEM) is then used to measure the width of the sidewall spacer (24). The measured value for the width of the sidewall spacer (24) is then used to adjust a subsequent integrated circuit fabrication process, such as a spacer etch process, an implant process, or an anneal process. As a result, transistors with improved drain saturation currents are fabricated.

25 Claims, 6 Drawing Sheets

METHOD FOR FORMING A TRANSISTOR WITHIN AN INTEGRATED CIRCUIT

FIELD OF THE INVENTION

The present invention relates to integrated circuit fabrication, and more specifically to a method for forming a transistor within an integrated circuit.

BACKGROUND OF THE INVENTION

The semiconductor industry continually strives to increase device performance by reducing the distance between individual devices, and by reducing the size of the devices themselves. Unfortunately, this continuing reduction in device dimensions has begun to adversely effect the performance and the reliability of integrated circuits.

Specifically, the reduction in transistor gate length has made it more difficult to control the drain saturation current of submicron transistors, especially submicron PMOS transistors. The source and drain regions of a transistor are fabricated using dopants that rapidly diffuse through silicon. Present integrated circuit fabrication processes, however, cannot uniformly and repeatedly control the lateral diffusion of these dopants. As a result, submicron transistors often have non-uniform drain saturation currents. This occurs because the overlap between the gate electrode and the source and drain regions cannot be repeatedly controlled, due to the uncontrolled lateral diffusion of the dopants which are used to form the source and drain regions.

Accordingly, a need exists for a method to form transistors in an integrated circuit which have improved drain saturation currents.

BRIEF DESCRIPTION OF THE DRAWINGS

The present invention may be more fully understood by a description of certain preferred embodiments in conjunction with the attached drawings in which.

DETAILED DESCRIPTION OF THE PREFERRED EMBODIMENT

Figure 1:
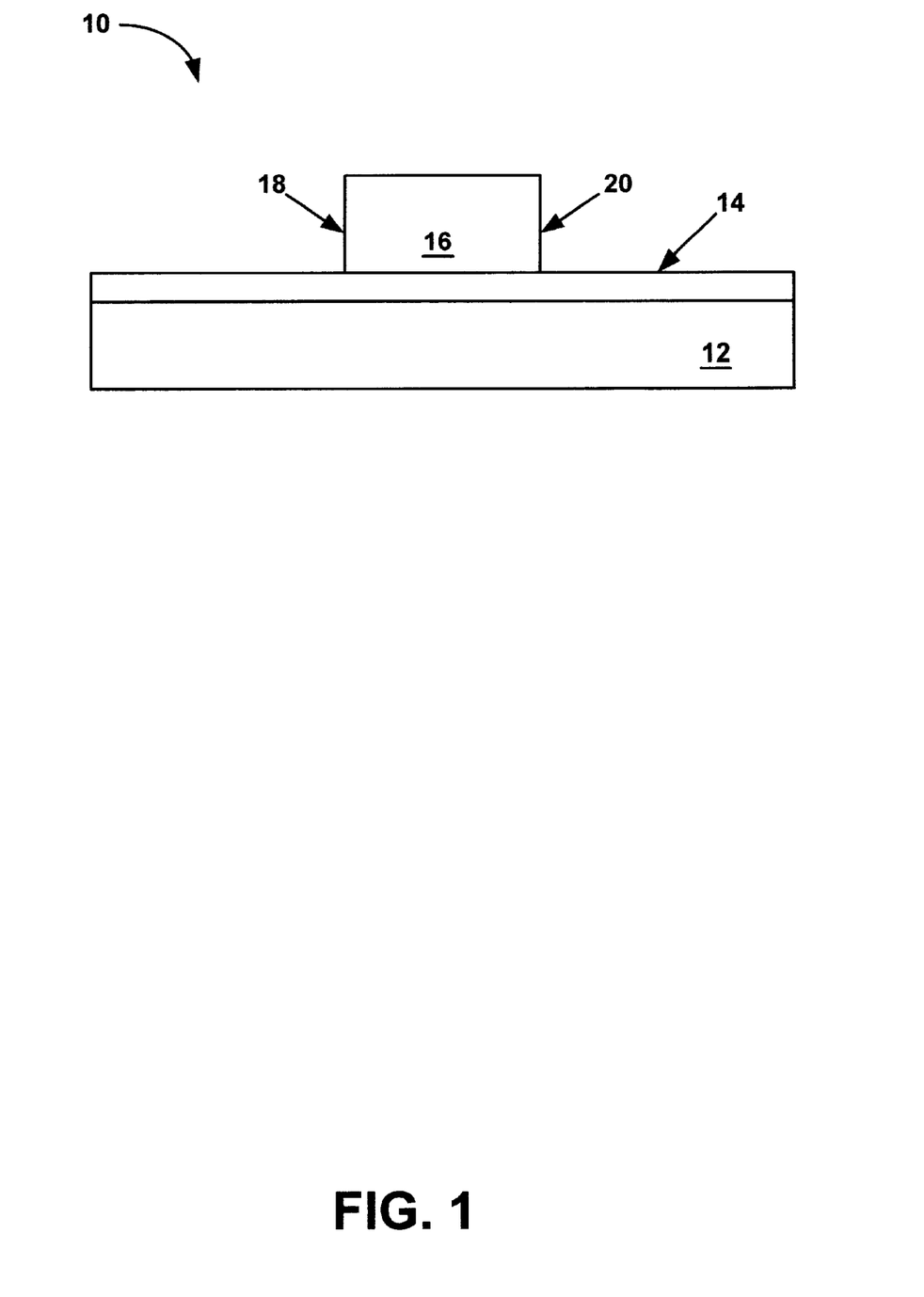
FIGS. 1–6 illustrate, in cross-section and plan view, process steps in accordance with the present invention.

FIGS. 1 through 6, illustrate in cross-section and plan view, process steps for forming a transistor in an integrated circuit in accordance with the present invention. Shown in FIG. 1, is a portion of an integrated circuit structure 10 comprising a semiconductor substrate 12, a gate dielectric layer 14, and a gate electrode 16 having a sidewall 18 and a sidewall 20.

In one embodiment, semiconductor substrate 12 is a monocrystalline silicon substrate. Alternatively, semiconductor substrate 12 may be a silicon-on-insulator (SOI) substrate, a silicon-on-sapphire (SOS) substrate, a silicon-germanium substrate, or the like.

Gate dielectric layer 14 overlies semiconductor substrate 12, and in one embodiment gate dielectric layer 14 is a layer of thermal silicon dioxide, which is formed by thermally oxidizing a portion of semiconductor substrate 12. Alternatively, gate dielectric layer 14 may be a layer of silicon nitride, a layer of silicon oxynitride, a layer of chemical vapor deposited silicon dioxide, or the like. In addition, a combination of the foregoing dielectric materials may also be used to form gate dielectric layer 14. For example, gate dielectric layer 14 may comprise a layer of silicon oxynitride overlying a layer of thermal silicon dioxide, or a layer of chemically vapor deposited silicon dioxide overlying a layer of thermal silicon dioxide.

Gate electrode 16 overlies gate dielectric layer 14, and is formed using conventional photolithographic patterning and etching techniques. Gate electrode 16 may be formed using a silicon layer such as polysilicon or amorphous silicon, a metal layer such as copper, tantalum, molybdenum or tungsten, a metal silicide layer such as tungsten silicide, titanium silicide or cobalt silicide, a metal nitride layer such as titanium nitride, tantalum nitride or tungsten nitride, tungsten-silicon-nitride, or the like. In addition, a combination of the foregoing materials may also be used to form gate electrode 16. For example, gate electrode 16 may comprise a layer of cobalt silicide overlying a layer of polysilicon, or a layer of tungsten nitride overlying a layer of tungsten.

Figure 2:
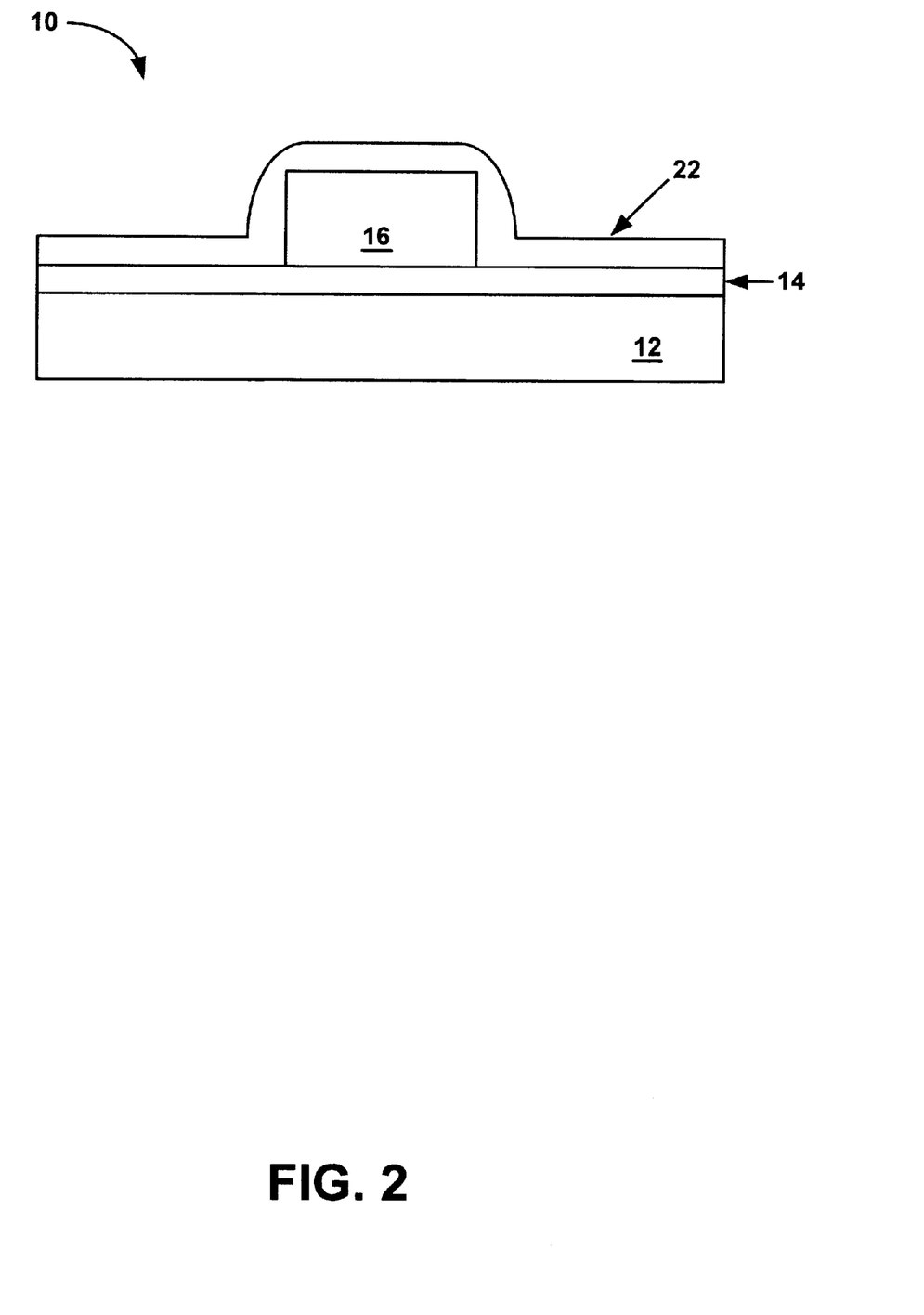

In FIG. 2, a spacer layer 22 is formed overlying gate electrode 16. In one embodiment spacer layer 22 is a dielectric layer, such as a layer of silicon dioxide, a layer of silicon nitride, a layer of boro-phosphate-silicate-glass (BPSG), a layer of phosphate-silicate-glass (PSG), a layer of spin-on-glass (SOG), a layer of silicon oxynitride, or the like. In addition, a combination of the foregoing dielectric materials may also be used to form spacer layer 22. For example, spacer layer 22 may comprise a layer of silicon nitride overlying a layer of silicon dioxide, or a layer of BPSG overlying a layer of silicon oxynitride. In an alternative embodiment, spacer layer 22 is a silicon layer, such as a layer of polysilicon, or amorphous silicon. Spacer layer 22 may be formed using conventional plasma deposition techniques, chemical vapor deposition techniques, spin-on coating techniques, or a combination thereof. For example, in a particular embodiment wherein spacer layer 22 comprises a layer of silicon dioxide, spacer layer 22 may be plasma deposited using tetraethylorthosilicate (TEOS) as source gas. Similarly, in a particular embodiment wherein spacer layer 22 comprises a layer of silicon nitride or silicon oxynitride, spacer layer 22 may be plasma deposited using silane (SiH4) as a source gas. It should be appreciated that prior to forming spacer layer 22, a portion of gate electrode 16 may also be oxidized to form an oxide layer (not shown) that lies between a portion of gate electrode 16 and spacer layer 22. Similarly, it should also be appreciated that after forming spacer layer 22, a portion of gate electrode 16 may also be oxidized to form an oxide layer (not shown) that lies between a portion of gate electrode 16 and spacer layer 22.

Figure 3:
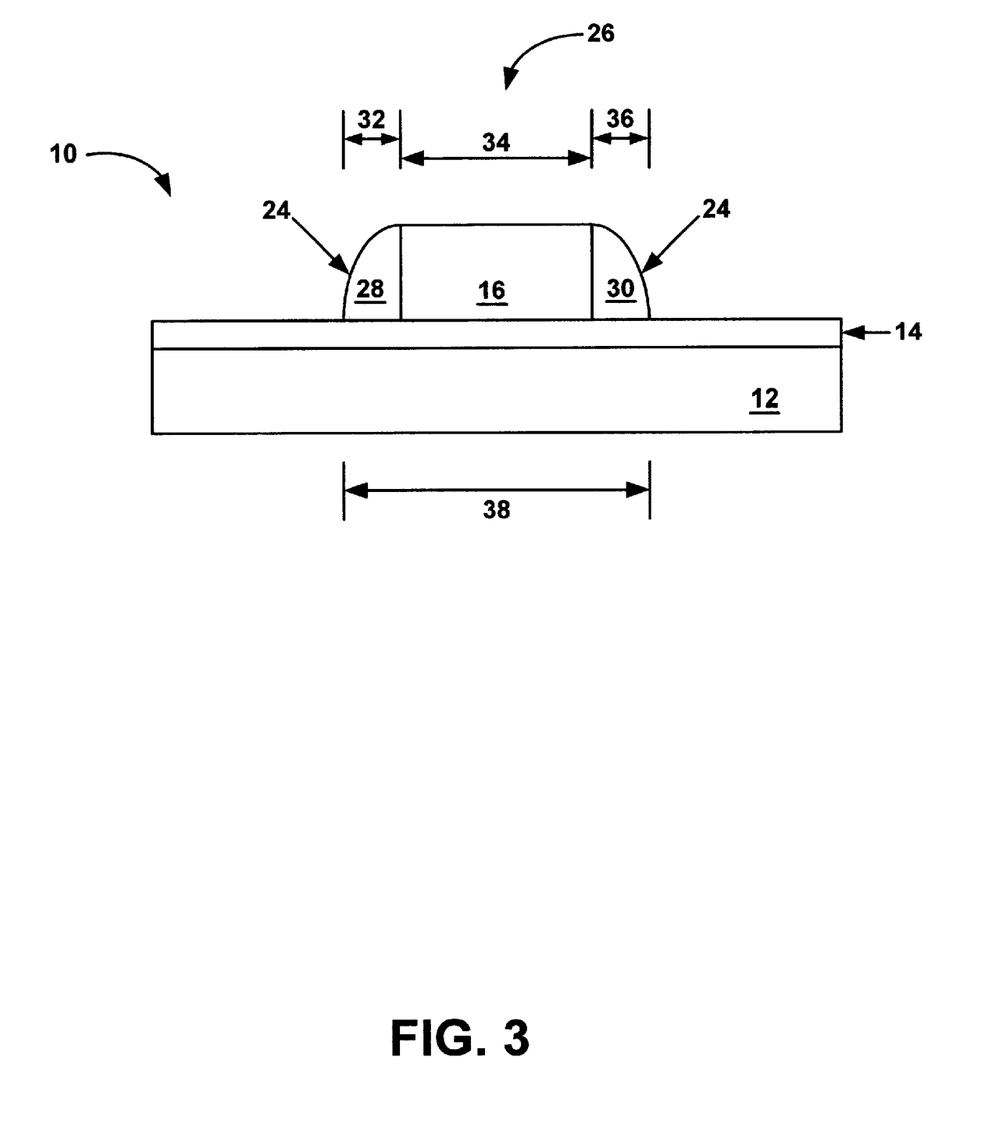

In FIG. 3, spacer layer 22 is then etched to form a structure 26 and a sidewall spacer 24, wherein structure 26 comprises sidewall spacer 24 and gate electrode 16. Sidewall spacer 24 has a first portion 28 and a second portion 30, and gate electrode 16 lies between first portion 28 and second portion 30, as shown in FIG. 3. In addition, first portion 28 has a sidewall spacer width 32, gate electrode 16 has a gate width 34, and second portion 30 has a sidewall spacer width 36. It is important to note that structure 26 has a total width 38 which comprises the sidewall spacer width 32, the gate width 34, and the sidewall spacer width 36, as shown in FIG. 3. In a preferred embodiment, first portion 28 and second portion 30 have approximately the same sidewall spacer width.

At least a portion of structure 26 is then measured in order to determine whether or not a process condition in a subsequent integrated circuit fabrication process needs to be adjusted. In one embodiment, the sidewall spacer width 32 of first portion 28 is measured. In an alternative embodiment, the sidewall spacer width 36 of second portion 30 is measured. In another embodiment, the total width 38 of structure 26 is measured. In yet another embodiment, the total width 38 of structure 26 and the gate width 34 of gate electrode 16 are measured in order to determine the sidewall spacer width 32 of first portion 28 and/or the sidewall spacer width 36 of second portion 30. In a preferred embodiment, these measurements are made using a scanning electron microscope (SEM). In one embodiment these measurements are made without cleaving structure 26, and thus it is non-destructively measured. In an alternative embodiment structure 26 is cleaved, and thus it is destructively measured.

In one embodiment, at least a portion of structure 26 is measured in order to determine whether or not an etch condition in the spacer etch process needs to be adjusted. For example, if a portion of sidewall spacer 24 on semiconductor substrate 12 is measured and found to have a sidewall spacer width which is too large, then an etch condition in the spacer etch process is adjusted so that a sidewall spacer subsequently formed on a second semiconductor substrate has the appropriate sidewall spacer width. More specifically, the spacer etch process is adjusted to decrease the sidewall spacer width of the sidewall spacer formed on the second semiconductor substrate. It should be appreciated that this can be achieved in a variety of ways. For example, one or more of the following etch conditions may be adjusted in order to obtained the desired sidewall spacer width on the second semiconductor substrate: RF power, magnetic field strength, an etch gas flow rate, an etch gas flow ratio, electrostatic chuck temperature, etch pressure, or the like. For example, in a particular embodiment wherein spacer layer 22 comprises silicon dioxide the carbon tetrafluoride (CF4) to trifluoromethane (CHF3) flow ratio may be adjusted in order to achieve the desired sidewall spacer width. Similarly, if a portion of sidewall spacer 24 on semiconductor substrate 12 is measured and found to have a sidewall spacer width which is too small, then an etch condition in the spacer etch process is adjusted so that a sidewall spacer subsequently formed on a second semiconductor substrate has the appropriate sidewall spacer width. More specifically, the spacer etch process is adjusted to increase the sidewall spacer width of the sidewall spacer formed on the second semiconductor substrate. It should be appreciated that this can be achieved in a variety of ways. For example, one or more of the following etch conditions may be adjusted in order to obtained the desired sidewall spacer width: RF power, magnetic field strength, an etch gas flow rate, an etch gas flow ratio, electrostatic chuck temperature, etch pressure, or the like. For example, in a particular embodiment wherein spacer layer 22 comprises silicon dioxide the carbon tetrafluoride (CF4) to trifluoromethane (CHF3) flow ratio may be adjusted in order to achieve the desired sidewall spacer width.

It should be appreciated that monitoring and adjusting the spacer etch process, as described above, allows transistors with improved drain saturation currents to be fabricated. A uniform and repeatable lateral diffusion distance for source and drain dopants is achieved by controlling the sidewall spacer width. Therefore, uniform and repeatable overlap between the gate electrode and the source and drain regions is achieved, and transistors having improved drain saturation currents are fabricated with the present invention.

Figure 4:
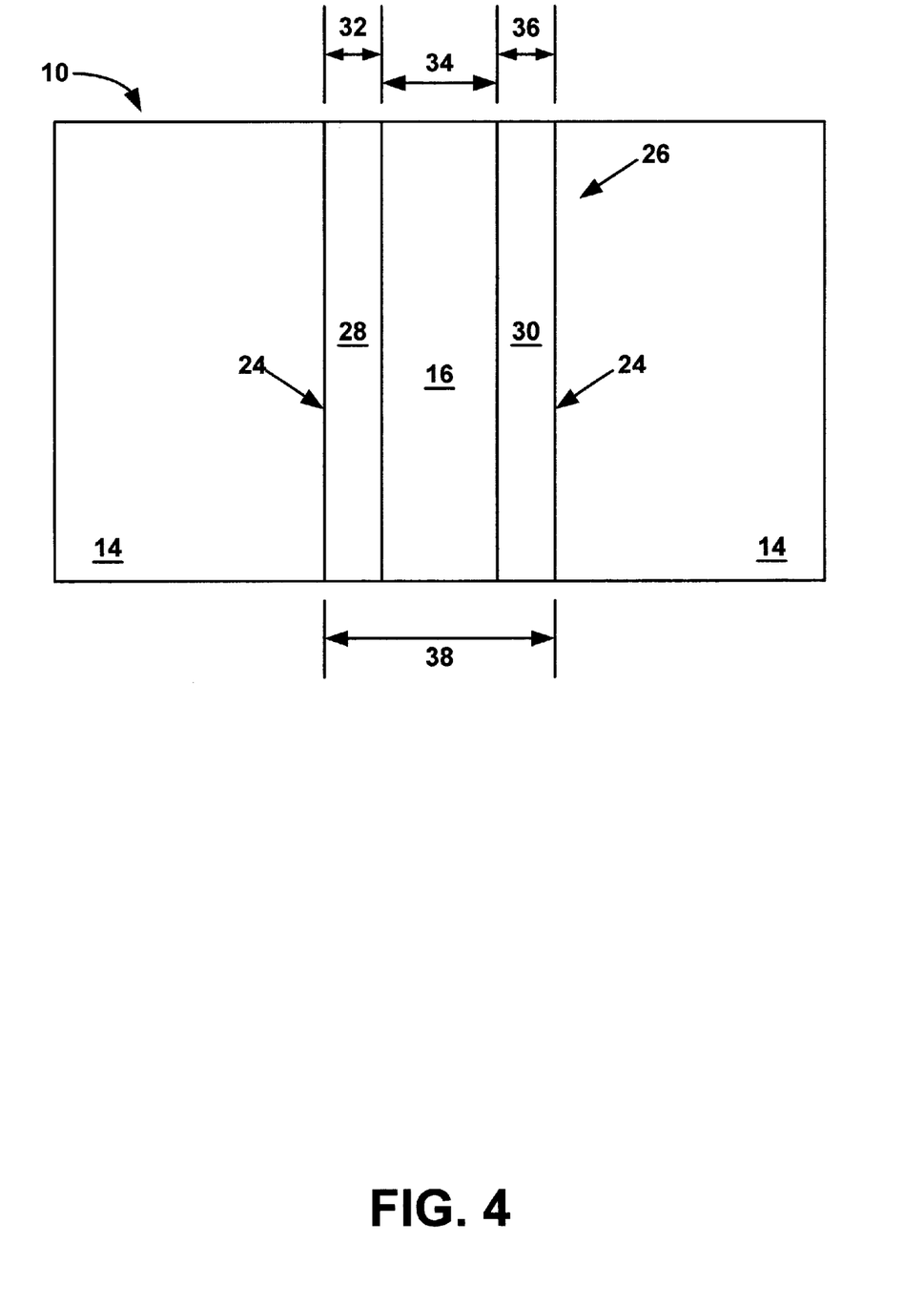

Shown in FIG. 4, is a top down view of integrated circuit structure 10 of FIG. 3.

Figure 5:
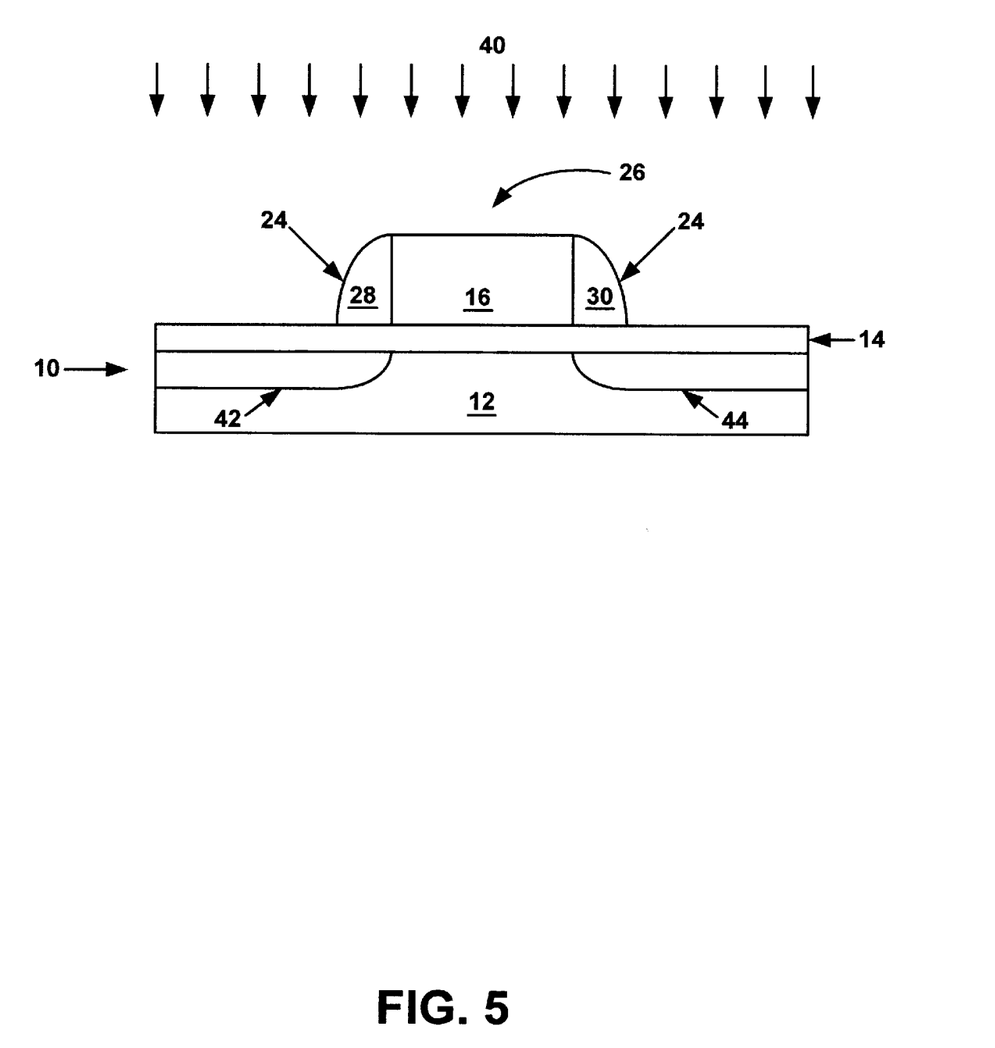

In FIG. 5, a dopant 40 is then implanted into a portion of semiconductor substrate 12 to form doped region 42 and doped region 44. In one embodiment, dopant 40 comprises a p-type dopant, such as boron (B) or boron difluoride (BF2), and doped region 42 and doped region 44 are p-type conductivity regions. In alternative embodiment, dopant 40 comprises an n-type dopant, such as arsenic (As), phosphorous (P), or antimony (Sb), and doped region 42 and doped region 44 are n-type conductivity regions.

In an alternative embodiment of the present invention, at least a portion of structure 26 is measured in order to determine whether or not an implant condition in the implant process needs to be adjusted prior to forming doped region 42 and doped region 44. For example, if a portion of sidewall spacer 24 is measured and found to have a sidewall spacer width which is too large, then the implant dose can be increased to increase the doping concentration of doped region 42 and doped region 44. Similarly, if a portion of sidewall spacer 24 is measured and found to have a sidewall spacer width which is too small, then the implant dose can be decreased to decrease the doping concentration of doped region 42 and doped region 44. Alternatively, if a portion of sidewall spacer 24 is measured and found to have a sidewall spacer width which is too large, then the implant energy can be increased to increase the lateral straggle of dopant 40 within semiconductor substrate 12. Similarly, if a portion of sidewall spacer 24 is measured and found to have a sidewall spacer width which is too small, then the implant dose can be decreased to decrease the lateral straggle of dopant 40 within semiconductor substrate 12. It should be appreciated that other implant conditions, besides energy and dose may be adjusted. For example, implant temperature or implant angle may also be adjusted to form doped region 42 and doped region 44.

It should be appreciated that adjusting the implant process based on measurements taken after the spacer etch process, as described above, allows transistors with improved drain saturation currents to be fabricated. A uniform and repeatable lateral diffusion distance for source and drain dopants is achieved by controlling the implant process. Therefore, uniform and repeatable overlap between the gate electrode and the source and drain regions is achieved, and transistors having improved drain saturation currents are fabricated with the present invention.

Figure 6:
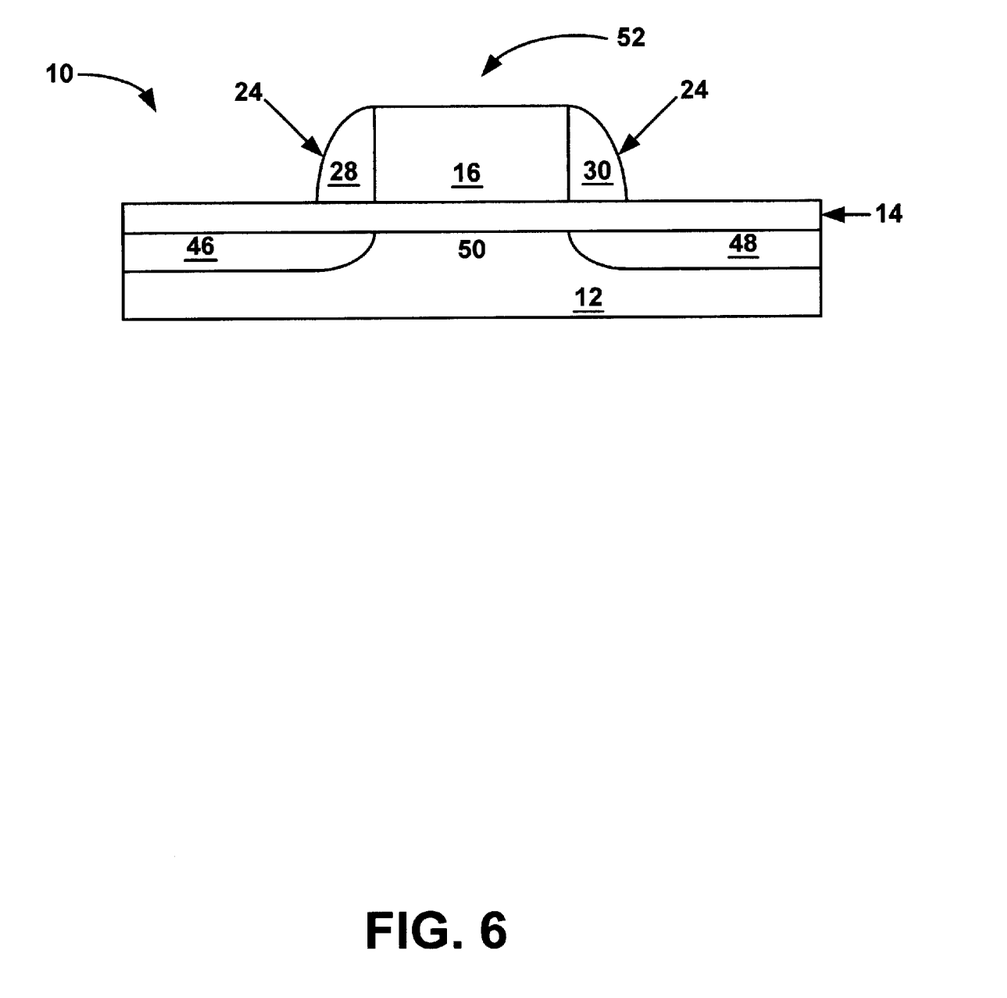

In FIG. 6, doped region 42 and doped region 44 are then annealed to form annealed region 46 and annealed region 48. The anneal causes dopant within doped region 42 to laterally diffuse under first portion 28 of sidewall spacer 24, and dopant within doped region 44 to laterally diffuse under second portion 30 of sidewall spacer 24, as shown in FIG. 6. Note, in this particular embodiment annealed region 46 and annealed region 48 define a channel region 50 for a transistor 52, wherein transistor 52 comprises gate electrode 16, gate dielectric layer 14, annealed region 46, annealed region 48, and channel region 50.

Note, in this particular embodiment, transistor 52 is formed without lightly doped drain (LDD) regions. It should be appreciated, however, that transistor 52 may also be formed with LDD regions. In that case, prior to depositing spacer layer 22, a dopant similar to that described in FIG. 5 would be introduced into semiconductor substrate 12 using gate electrode 16 as an implant mask to form lightly doped regions on either side of gate electrode 16. Note if transistor 52 is an NMOS transistor then the LDD regions would be n-type conductivity regions, and if transistor 52 is a PMOS transistor then the LDD regions would be p-type conductivity regions.

In another embodiment of the present invention, at least a portion of structure 26 is measured in order to determine whether or not an annealing condition in the anneal process needs to be adjusted prior to forming annealed region 46 and annealed region 48. For example, if a portion of sidewall spacer 24 is measured and found to have a sidewall spacer width which is too large, then the annealing temperature can be increased to increase the lateral diffusion distance of dopant from doped region 42 and doped region 44. Similarly, if a portion of sidewall spacer 24 is measured and found to have a sidewall spacer width which is too small, then the annealing temperature can be decreased to decrease the lateral diffusion distance of dopant from doped region 42 and doped region 44. Alternatively, if a portion of sidewall spacer 24 is measured and found to have a sidewall spacer width which is too large, then the annealing time can be increased to increase the lateral diffusion distance of dopant from doped region 42 and doped region 44. Similarly, if a portion of sidewall spacer 24 is measured and found to have a sidewall spacer width which is too small, then the annealing time can be decreased to decrease the lateral diffusion distance of dopant from doped region 42 and doped region 44.

In a preferred embodiment, doped region 42 and doped region 44 are annealed in a rapid thermal annealing system for a time ranging from approximately 5 seconds to approximately 60 seconds, at a temperature ranging from approximately 700° C. to approximately 1100° C. In an alternative embodiment, doped regions 42 and doped regions 44 are annealed in a furnace system for time ranging from approximately 15 minutes to approximately 2 hours, at a temperature ranging from approximately 700° C. to approximately 900° C.

It should be appreciated that other annealing conditions besides temperature and time may also be adjusted. For example, the rate at which doped region 42 and doped region 44 are ramped up to the peak annealing temperature, the rate at which doped region 42 and doped region 44 are ramped down from the peak annealing temperature, or gas flow rate during the anneal may also be adjusted in order to form annealed region 46 and annealed region 48.

It should be appreciated that adjusting the anneal process based on measurements taken after the spacer etch process, as described above, allows transistors with improved drain saturation currents to be fabricated. A uniform and repeatable lateral diffusion distance for source and drain dopants is achieved by controlling the anneal process. Therefore, uniform and repeatable overlap between the gate electrode and the source and drain regions is achieved, and transistors having improved drain saturation currents are fabricated with the present invention.

Thus it is apparent that there has been provided, in accordance with the present invention, a method for forming a transistor within an integrated circuit that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

What is claimed is:

1. A method for forming a transistor within an integrated circuit comprising the steps of:

providing a semiconductor substrate;

forming a gate dielectric layer overlying the semiconductor substrate;

forming a gate electrode overlying the gate dielectric layer;

forming a spacer layer overlying the gate electrode;

etching the spacer layer to form a structure and a sidewall spacer, wherein the structure comprises the sidewall spacer and the gate electrode, and wherein a first portion of the sidewall spacer overlies a first portion of the semiconductor substrate, a second portion of the sidewall spacer overlies a second portion of the semiconductor substrate, and the gate electrode lies between the first portion of the sidewall spacer and the second portion of the sidewall spacer;

measuring at least a portion of the structure, after etching the spacer layer to determine an implant condition; and implanting a dopant into the semiconductor substrate using the implant condition to form a first doped region and a second doped region.

2. The method of claim 1, wherein the dopant comprises boron.

3. The method of claim 1, wherein the dopant comprises arsenic.

4. The method of claim 1, wherein the dopant comprises phosphorous.

5. The method of claim 1, wherein the dopant comprises antimony.

6. The method of claim 1, wherein the portion of the structure is measured using a scanning electron microscope (SEM).

7. The method of claim 1, wherein the implant condition is an implant dosage.

8. The method of claim 1, wherein the implant condition is an implant energy.

9. The method of claim 1, wherein the step of measuring at least a portion of the structure is further characterized as measuring a width of the first portion of the sidewall spacer.

10. The method of claim 1, wherein the step of measuring at least a portion of the structure is further characterized as measuring a total width of the structure.

11. A method for forming a transistor within an integrated circuit comprising the steps of:

providing a semiconductor substrate;

forming a gate dielectric layer overlying the semiconductor substrate;

forming a gate electrode overlying the gate dielectric layer;

forming a spacer layer overlying the gate electrode;

etching the spacer layer to form a structure and a sidewall spacer, wherein the structure comprises the sidewall spacer and the gate electrode, and wherein a first portion of the sidewall spacer overlies a first portion of the semiconductor substrate, a second portion of the sidewall spacer overlies a second portion of the semiconductor substrate, and the gate electrode lies between the first portion of the sidewall spacer and the second portion of the sidewall spacer;

measuring at least a portion of the structure, after etching the spacer layer to determine an anneal condition;

implanting a dopant into the semiconductor substrate to form a first doped region and a second doped region; and annealing the first doped region and the second doped region using the anneal condition.

12. The method of claim 11, wherein the anneal condition is an annealing temperature.

13. The method of claim 11, wherein the anneal condition is an annealing time.

14. The method of claim 11, wherein the first doped region and the second doped region are annealed using a rapid thermal annealing system.

15. The method of claim 11, wherein the portion of the structure is measured using a scanning electron microscope (SEM).

16. The method of claim 11, wherein the step of measuring at least a portion of the structure is further characterized as measuring a width of the first portion of the sidewall spacer.

17. The method of claim 11, wherein the step of measuring at least a portion of the structure is further characterized as measuring a total width of the structure.

18. A method for forming transistor within an integrated circuit comprising the steps of:

providing a first semiconductor substrate, the first semiconductor substrate having a first gate electrode overlying a first portion of the first semiconductor substrate, and a first spacer layer overlying the first gate electrode;

etching the first spacer layer to form a structure and a first sidewall spacer, wherein the structure comprises the first sidewall spacer and the first gate electrode, and wherein a first portion of the first sidewall spacer overlies a second portion of the first semiconductor substrate, a second portion of the first sidewall spacer overlies a third portion of the first semiconductor substrate, and the first gate electrode lies between the first portion of the first sidewall spacer and the second portion of the first sidewall spacer;

measuring at least a portion of the structure, after etching the first spacer layer to determine an etch condition; and providing a second semiconductor substrate, the second semiconductor substrate having a second gate electrode overlying a first portion of the second semiconductor substrate, and a second spacer layer overlying the second gate electrode; and etching the second spacer layer using the etch condition to form a second sidewall spacer, wherein a first portion of the second sidewall spacer overlies a second portion of the second semiconductor substrate, a second portion of the second sidewall spacer overlies a third portion of the second semiconductor substrate, and the second gate electrode lies between the first portion of the second sidewall spacer and the second portion of the second sidewall spacer.

19. The method of claim 18, wherein the etch condition is an RF power level.

20. The method of claim 18, wherein the etch condition is a gas flow rate.

21. The method of claim 18, wherein the etch condition is a gas flow ratio.

22. The method of claim 18, wherein the etch condition is an electro-static chuck temperature.

23. The method of claim 18, wherein the portion of the structure is measured using a scanning electron microscope (SEM).

24. The method of claim 18, wherein the step of measuring at least a portion of the structure is further characterized as measuring a width of the first portion of the first sidewall spacer.

25. The method of claim 18, wherein the step of measuring at least a portion of the structure is further characterized as measuring a total width of the structure.

* * * * *